United States Patent [19]
Kaya et al.

[11] Patent Number: 5,821,581
[45] Date of Patent: Oct. 13, 1998

[54] NON-VOLATILE MEMORY CELL STRUCTURE AND PROCESS FOR FORMING SAME

[75] Inventors: Cetin Kaya, Dallas; Howard Tigelaar, Allen, both of Tex.

[73] Assignee: Texas Instruments Incorporated, Dallas, Tex.

[21] Appl. No.: 93,517

[22] Filed: Jul. 19, 1993

Related U.S. Application Data

[63] Continuation of Ser. No. 641,952, Jan. 17, 1991, abandoned.
[51] Int. Cl.$^6$ .................................................. H01L 29/780
[52] U.S. Cl. ......................... 257/321; 257/315; 257/322; 365/185.28
[58] Field of Search ................................... 257/315, 321, 257/322

[56] References Cited

U.S. PATENT DOCUMENTS

| | | | |
|---|---|---|---|
| 4,317,272 | 3/1982 | Kuo et al. | 257/316 |
| 4,373,248 | 2/1983 | McElroy . | |
| 4,409,723 | 10/1983 | Harari . | |
| 4,639,893 | 1/1987 | Eitan . | |
| 4,750,024 | 6/1988 | Schreck | 257/316 |
| 4,783,766 | 11/1988 | Samachisa et al. | 257/316 |
| 4,794,565 | 12/1988 | Wu et al. | 257/316 |

OTHER PUBLICATIONS

*A 5 Volt High Density Poly–Poly Erase Flash EPROM Cell;* R. Kazerounian, S. Ali, Y. Ma, and B. Eitan; (IEDM, pp. 436–439), 1988.

Primary Examiner—Jerome Jackson, Jr.
Attorney, Agent, or Firm—Jacqueline J. Garner; W. James Brady, III; Richard L. Donaldson

[57] ABSTRACT

A non-volatile split-gate memory cell 8 which can be programmed with only a five volt power supply and is fabricated using standard transistor processing methods, comprises a semiconductor substrate 10 with a source 12 and a drain 14 region separated by a channel region 16. A conductive floating gate 18 is formed over a portion 16a of the channel region 16 and separated by a FAMOS oxide 20. A conductive control gate 22 is formed over but electrically insulated from the floating gate 18 and over a second portion 16b of the channel region 16. The control gate 22 is separated from the second portion of the channel 16b by a pass oxide 26 which is thicker than the FAMOS oxide 20. Other embodiments and processes are also disclosed.

3 Claims, 5 Drawing Sheets

NON-VOLATILE MEMORY CELL STRUCTURE AND PROCESS FOR FORMING SAME

This application is a Continuation of application Ser. No. 07/641,952, filed Jan. 17, 1991, now abandoned.

(C) Copyright, *M* Texas Instruments Incorporated 1990. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor memories and more particularly relates to five volt programmable read only memories.

BACKGROUND OF THE INVENTION

A read-only memory (ROM) is a type of memory in which data can be permanently stored, for example, by blowing metallic links during programming thereof. Such type of memory can be conventionally accessed at specific locations to read the programmed contents thereof. A much more versatile type of ROM is the electrically programmable read-only memory (EPROM) which can be electrically programmed to store data. Some versions of these devices store data permanently; others, however, can be erased with ultraviolet light or an electrical current.

The construction of an EPROM cell is similar to that of a field effect transistor, but additionally includes a floating gate between the gate conductor and the conduction channel of the transistor. During programming to store a desired logic state, electrons flowing in the conduction channel are attracted and trapped in the floating gate. This condition increases the threshold voltage of the transistor, thereby rendering it cutoff in response to normal read operation voltages. Hence, during reading of a transistor cell so programmed, the transistor will remain nonconductive and thus represent a high impedance between the source and drain. On the other hand, cells which have not been programmed will remain conductive in response to normal read operation voltages. In this manner, the memory can be programmed.

To program the EPROM cell, a relatively large voltage is applied to the control gate, the drain is biased to 6 to 8 volts while the source is grounded. The channel current which flows between source and drain is on the order of 1 to 5 milliamps. This appreciable current load necessitates the use of an external power supply, typically 12 volts. One example of a EPROM which is programmed as discussed above is described by B. Eitan in U.S. Pat. No. 4,639,893.

In portable PC applications and some system designs, there is a growing interest in nonvolatile memories which use a single 5 volt power supply. One EPROM cell which can be programmed with five volts is described by R. Kazerounian et.al. ("A 5 Volt High Density Poly-Poly Flash Erase EPROM Cell", IEDM, 1988). This cell consists of a single self-aligned split gate EPROM device and a shared poly erase gate. This invention requires a separate gate (wordline) which is used during write, read and erase. This additional gate increases the cell area. Both this cell and the one described in the U.S. Pat. No. 4,639,893 are built using rather involved, non-standard processes.

As discussed above, one problem has been the need for a power supply other than the five volt supply already found in most memory systems. Another problem faced in prior art methods where a multi-cell array exists is bitline stress, which is the deprogramming of already written cells during the programming of other cells sharing the same bit line. Accordingly, improvements which overcome any or all of the problems are presently desirable.

SUMMARY OF THE INVENTION

Generally this invention provides a non-volatile split-gate memory cell structure which can be programmed using only a five volt power source. Embodiments of the invention can be built as a single transistor structure or a dual transistor structure.

In the single transistor embodiment, a floating gate is formed over a portion of a channel region which separates highly doped source and drain regions and is separated from the channel by an insulation layer. A control gate is formed over but electrically insulated from the floating gate and is also formed over an additional portion of the channel region. The control gate is also separated from the channel by an insulation layer. This insulation layer, however, is thicker than the layer that separates the floating gate from the channel.

In the dual transistor embodiment, two channel regions share a common source region and are separated by a field oxide. The first transistor is used to write to the floating gate and is formed as described in the single transistor embodiment. The second transistor is used to read the cell. The difference with this second transistor is that the control gate is over the floating gate only. This structure will allow for faster read cycles.

The structure disclosed in this invention have several advantages over the prior art. The structure of the EPROM cell and the doping profile of the channel regions have been optimized so that adequate programming occurs with 5 volts or less applied to the drain. This eliminates the need for the voltage external power supply that is commonly used in the prior art.

Another advantage is that the structure requires only one gate per cell, therefore the cell area is smaller. This is clearly an advantage over the Kazerounian cell described above. In applications where the electrical erase is not required, the structure can use regular n-channel transistor implants; hence, eliminating any dedicated FAMOS source/drain implants. Also, in the preferred biasing condition, the device will be immune to bitline stress.

BRIEF DESCRIPTION OF THE DRAWINGS

The above features of the present invention will be more clearly understood for consideration of the following description in connection with the accompanying drawings in which.

Corresponding numerals and symbols in the different figures refer to corresponding parts unless otherwise indicated.

DETAILED DESCRIPTION OF PREFERRED EMBODIMENTS

The following detailed description is meant to be illustrative only and not limiting. Other embodiments of this invention will be obvious to those skilled in the art in view of the following description.

Figure 1:
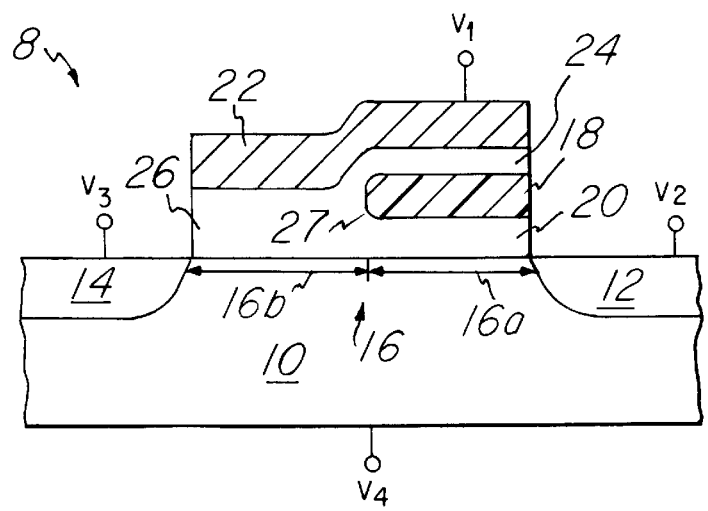
FIG. 1 is a greatly enlarged cross sectional view of the single transistor embodiment of the invention.

A cross sectional view of a single transistor embodiment of the invention disclosed herein is shown in FIG. 1. A split-gate memory cell 8 comprises a semiconductor substrate 10 which has doped source and drain regions 12 and 14, respectively, formed on the surface. It should be noted, of course, that the region 12 could be labeled as the drain and region 14 as the source. In one common embodiment, the substrate 10 comprises p-type silicon and the source and drain regions 12 and 14 are n+ doped silicon. The source 12 and drain 14 are separated by a channel region 16 which serves as the current path during device operation. Typical source/drain doping concentrations are well known in the current art. Of course, n-channel periphery transistor junctions can be used for UV erase EPROM applications or a deep junction for electrically erasable EPROMs, as is well known in the current art.

A conductive floating gate 18 is formed over a first portion 16a of the channel region 16. This floating gate 18 is typically comprised of polysilicon. An insulating layer 20, typically an oxide such as silicon dioxide, separates the floating gate 18 from the channel region 16a. The insulating layer 20 is often called the FAMOS (Floating gate Avalanche Metal Oxide Semiconductor) gate oxide and is typically 80 to 120 Å thick for flash EPROMs and 80 to 200 Å thick for UV erasable EPROMs.

A conductive control gate 22, typically comprised of polysilicon, is formed over the floating gate 18 and over a second portion 16b of the channel region 16. The second portion of the channel region 16b is the portion of the channel region 16 which is beneath control gate 22 but not beneath floating gate 18. The control gate 22 is separated from the floating gate 18 by an insulation layer 24 and the control gate 22 is separated from the second portion of the channel region 16b by an insulation layer 26. The insulation layer 26 is often called the pass transistor gate oxide and is typically 200 to 1000 Å thick. The source and drain regions, 12 and 14 respectively, are typically self aligned to the edge of control gate 22 and one edge of control gate 18. The thickness of the pass gate oxide 26 below the control gate 22 is greater than the thickness of the FAMOS oxide 20 beneath the floating gate 18.

To optimize the write characteristics of the memory cell 8, it may be desirable to dope the channel region 16, preferably with the doping concentration in region 16b greater than the concentration in region 16a. An example of average doping concentration of region 16a is typically between $6 \times 10^{16}$ and $2 \times 10^{17}$ while region 16b is typically between $1 \times 10^{17}$ and $4 \times 10^{17}$. These concentrations result in a higher body effect.

An example of a memory cell as described above would have a silicon p doped channel 16 with n+ doped source and drain regions, 12 and 14. Doping concentrations for these regions are well known in the art. In a preferred embodiment, a 2000 Å polysilicon floating gate 18 is formed over a 100 Å FAMOS oxide layer 20. A 3000 Å control gate 22 is formed over 500 Å pass oxide 26 and is electrically insulated from the floating gate 18 by a dielectric layer 24 which is comprised of 125 Å oxide and 150 Å silicon nitride. All the oxide layers are comprised of silicon dioxide.

The memory cell 8 is programmed (written to) utilizing a phenomena known as hot electron injection. EPROM devices typically utilize this phenomena, for example. A typical example of programming would comprise applying a twelve volt voltage $V_1$ to the control gate 22. The voltage can be supplied by a charge pump since little or no current will be drawn from the control gate 22, which is electrically insulated from the remainder of the structure. The source voltage $V_3$ is then set to zero (ie., grounded) and the drain voltage $V_2$ is set to five volts. In this configuration, electrons will be driven from the source 14 to the drain 12. Some of them will gain enough energy from the channel electric field and be injected into the FAMOS gate oxide 20 towards the floating gate 18. Because the pass oxide 26 is relatively thick compared to the FAMOS oxide 20 very few electrons will tunnel to the control gate 22. In approximately 100 microseconds the power sources are turned off and the floating gate 18 is charged to approximately –2 to –4 volts. This excess charge increases the threshold voltage of the transistor, thereby rendering it cutoff in response to normal read operation voltages. The charge which has built up on the floating gate 18 will remain for many years under normal read operations.

To further improve the write characteristics of the memory cell 8, a back bias, $V_4$, may be applied to the substrate 10. Typically, a back bias $V_4$ of –2 to –3 volts is used. Since this substrate current is typically on the order of a microamp, the back bias voltage $V_4$ can easily be supplied by a charge pump. During the write process, hot electrons are injected into the floating gate 18 at the end nearest the center of the cell structure, denoted at point 27 in FIG. 1. This injection point is unique compared to prior art methods, where electrons are typically injected at the end of floating gate 18 adjacent to drain region 12.

One of the advantages of the proposed structure is that the cell can also be programmed by reversing the source voltage $V_3$ and the drain voltage $V_2$. Again, the electron injection takes place at point 27 in the center of the cell. This configuration also offers total immunity to bit line stress, which is a major reliability problem for non-volatile cells.

The memory cell 8 is typically read with 1 volt on the drain 14 ($V_3=1V$), 5 volts on the control gate 22 ($V_1=5V$), and the source 12 grounded ($V_2=0V$). The state of the memory cell 8 is determined by the existence or absence of a conductive channel 16 between the source 12 and drain 14.

In addition, the memory cell 8 can be erased. The erase procedure is initiated by applying approximately –11 volts on the control gate 22 ($V_1=-11V$) and 5 volts on the source 12 ($V_2=5V$). The floating gate will be discharged by the tunneling of electrons from it to the source region 12.

Figure 2:
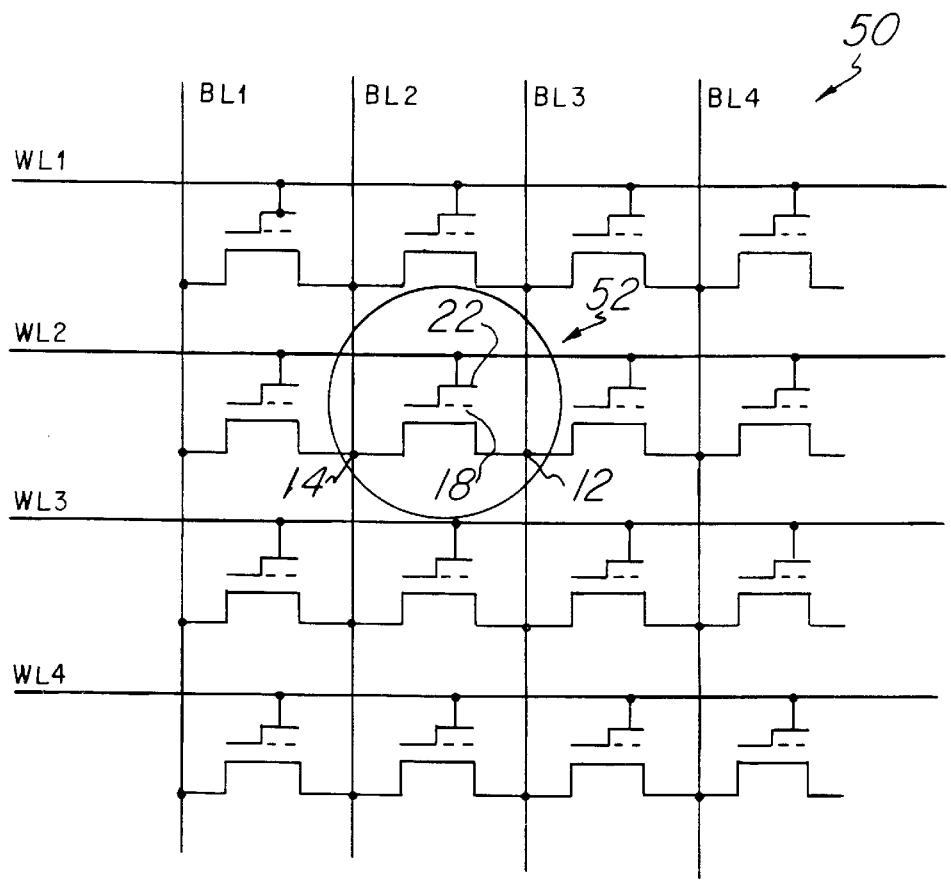
FIG. 2 is a schematic representation of a portion of multi-cell memory array.

Of course, it should be noted that the memory cell 8 described above could be one of many such cells in a larger memory array. A portion of one such array, generally noted at 50, is shown schematically in FIG. 2 which shows 16 cells as described above. In this configuration, adjacent cells share doped regions. In other words, the drain region of one cell is also the source region of an adjacent cell. These regions are referred to as bit lines and are shown in FIG. 2 as BL1, BL2, BL3, and BL4. Also, an entire row of devices share a single control gate referred to as a word line. The word lines in FIG. 2 are WL1, WL2, WL3, and WL4.

To illustrate the operation of a cell in the array consider the cell 52 which has source region BL2, drain region BL3, and control gate WL2. In a preferred write process, 5 volts is applied to BL2, 12 volts is applied to WL2 and BL3 is grounded. The other bit lines float while the other word lines are grounded. A backbias of −3 volts may also be applied to the substrate (not shown in FIG. 2). As noted earlier, the voltages on the source and drain, ie., BL2 and BL3, may be reversed.

The memory cell 52 is read by applying 1 to 2 volts to BL2, 5 volts to WL2, and grounding BL3. Once again, the other bit lines float while the other word lines are grounded. The read occurs as described earlier with respect to the single cell structure.

The memory cell 52 can be erased by applying 5 volts to all the bit lines and −11 volts to all the word lines. As this is a bulk erase, all cells in the structure will be erased. With a more complicated biasing scheme, single cells may also be erased.

Figure 3:
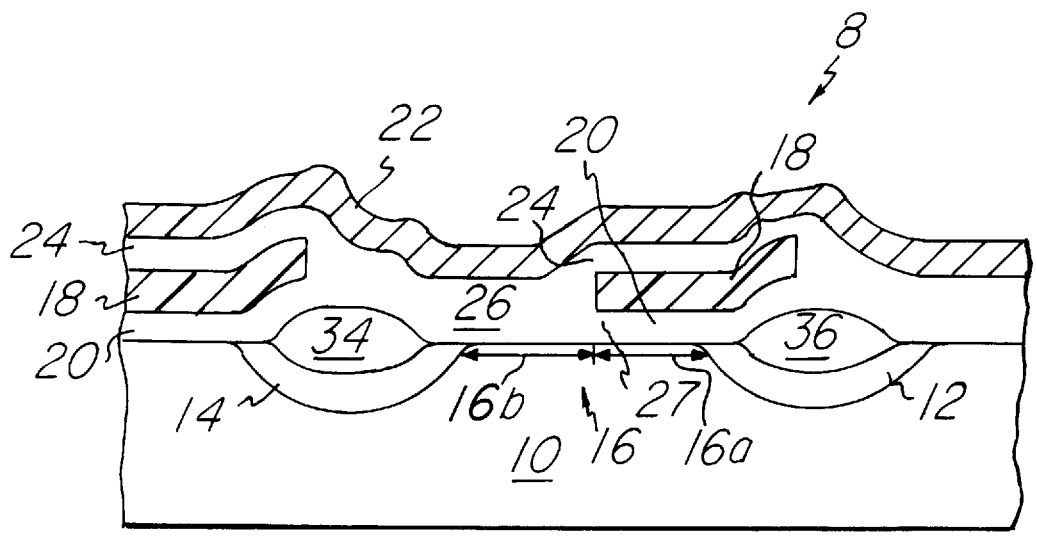
FIG. 3 is a cross section view of an alternate embodiment structure.

In another embodiment, the memory cell structure may also be built as described in U.S. Pat. No. 4,373,248, incorporated herein by reference. FIG. 3 illustrates an example of this structure. Here, a single cell and portions of two adjacent cells are shown. The source 14 of one cell will also serve as the drain 12 of an adjacent cell. In this structure, dielectric layers 34 and 36, typically comprised of silicon dioxide and approximately 2500 Å thick, are formed substantially over most of the source 12 and drain 14 regions. In this configuration, the control gate 22 and floating gate 18 are not self-aligned with the source 12 and drain 14 regions. This structure provides the advantage of small and contactless array cells.

The preceding examples are typical of possible configurations for the non-volatile memory cells; however, as is well known in the art, the voltages, structure sizes and doping concentrations can be varied and similar results achieved.

Figure 4:
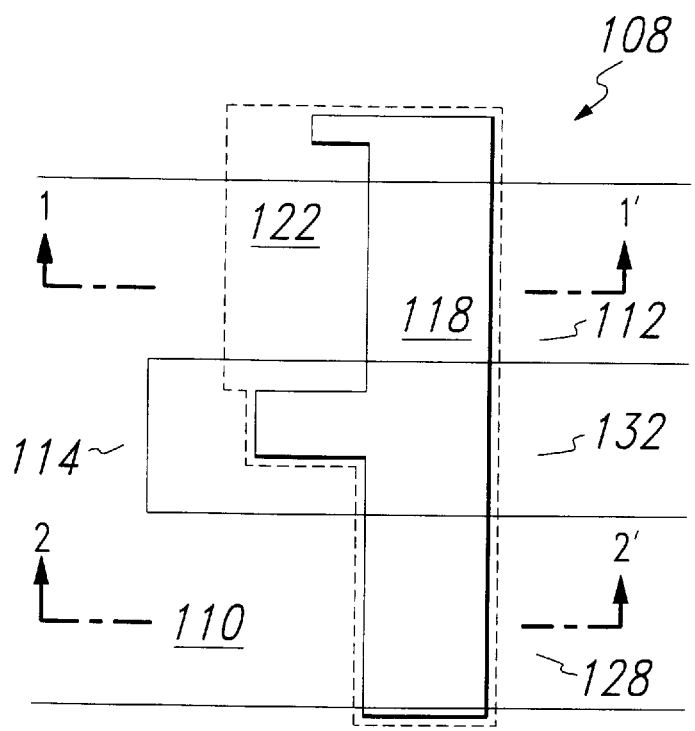
FIG. 4 is a top view of the dual transistor embodiment of the invention.
Figure 5:
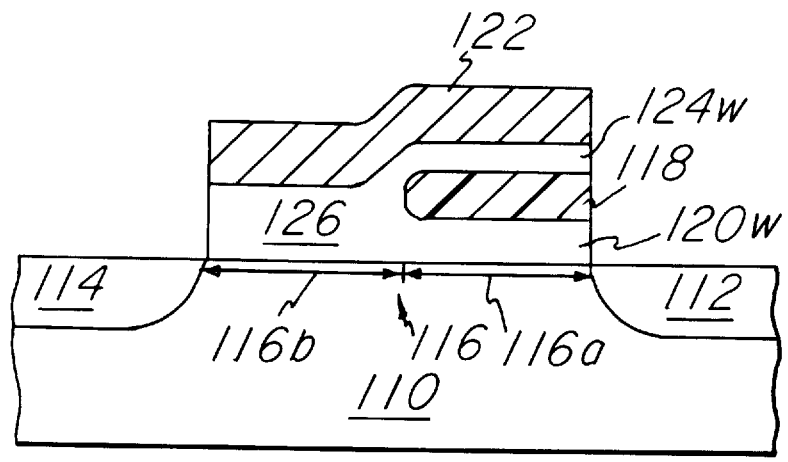
FIG. 5 is a cross sectional view the write transistor of the embodiment shown in FIG. 2.

A top-view of a second preferred embodiment, a dual transistor split-gate memory cell is shown in FIG. 4. This structure is used for an electrically programmable logic device (EPLD), for example. This structure is similar to the single transistor structure described above, but also has a read transistor to speed up the read operations. FIG. 5 shows a cross-sectional view AA of the write portion of the structure in FIG. 4 and FIG. 6 shows a cross-sectional view BB of the read portion of the structure in FIG. 4.

Referring now to FIG. 4, a memory cell 108 comprises a semiconductor substrate 110 which has a single doped source region 114 and two doped drain regions 112 and 128. The transistor formed by the source region 114 and the first drain region 112 will herein be referred to as the write transistor and the transistor formed by the source region 114 and the second drain region 128 will herein be referred to as the read transistor. In one common embodiment, the substrate 110 comprises p doped silicon and the doped regions 112, 114, and 128 comprise n+ doped silicon.

Figure 6:
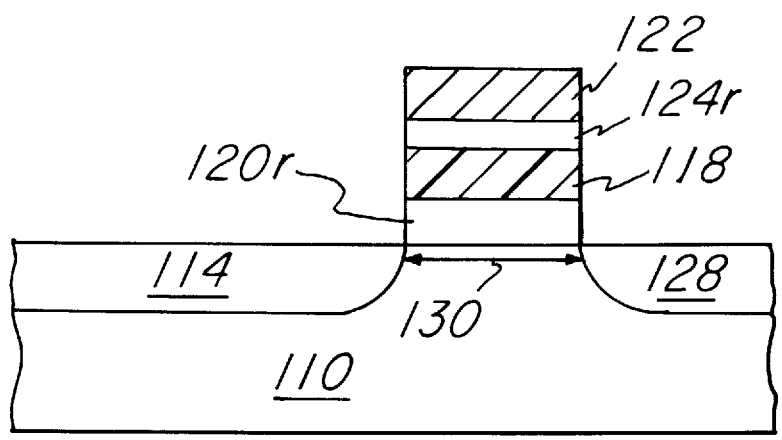
FIG. 6 is a cross sectional view the read transistor of the embodiment shown in FIG. 2.

Referring now to FIG. 5 and FIG. 6, in conjunction with FIG. 4, the source region 114 and the drain region 112 of the write transistor are separated by a channel region 116. Likewise, the source region 114 and the drain region 128 of the read transistor are separated by a channel region 130. The two drain regions are separated by an insulating region 132, typically a field oxide 132.

To optimize the write characteristics of the memory cell 108, it may be desirable to dope the write transistor channel region 116, preferably with the doping concentration in region 116b greater than the concentration is region 116a. An example doping concentration of region 116a is typically between $6 \times 10^{16}$ and $2 \times 10^{17}$ while region 116b is typically between $1 \times 10^{17}$ and $4 \times 10^{17}$. These concentrations result in a higher body effect. Typically the doping in the read transistor channel 130 is lighter to minimize the read time.

Referring again to FIG. 5 and FIG. 6, in conjunction with FIG. 4, a conductive floating gate 118 is formed over a first portion of the write channel region 116a, over the field oxide 132 and over the read channel region 130. The floating gate 118 is typically comprised of polysilicon. An insulating layer 120, typically an oxide such as silicon dioxide, separates the floating gate 118 from the write channel region 116a, shown as 120W in FIG. 5, and separates the floating gate 118 from the read channel 130, shown as 120R in FIG. 6. As described above, the oxide layer 120 is commonly referred to as the FAMOS oxide and is typically 80 to 120 Å for a flash EPROM cell and 80 to 200 Å for a UV erase EPROM cell. The thickness of the FAMOS oxide in the write transistor 120W is typically the same as the thickness of the FAMOS oxide in the read transistor 120R.

A conductive control gate 122, typically comprising polysilicon, is formed over the floating gate 118 and over a second portion 116b of the write channel region. The second portion of the write channel region 116b is the portion of the write channel region 116 which is beneath control gate 122 but not beneath floating gate 118. As shown in FIG. 6, for the read transistor the control gate 122 is formed over the floating gate 118 only. The control gate 122 is electrically isolated from the floating gate by an insulating layer 124. The layer 124 is typically comprised of an oxide, such as silicon dioxide, which is typically 125 Å thick and a nitride, such as silicon nitride, which is typically 150 Å thick in a stack configuration. This thickness is relatively uniform in the two transistors. Referring to FIG. 5, the control gate 122 is separated from the write channel region 116b by an insulating layer 126. The layer 126, commonly called the pass gate oxide, is typically an oxide such as silicon dioxide. The thickness of the pass gate oxide 126 is greater than the thickness of the write FAMOS oxide 120W in order to optimize the channel electric field which results in enhanced programming.

An example of a memory cell 108 as described above is formed on p doped substrate 110 with n+ doped source and drain regions. Doping concentrations are well known in the current art. A 2000 Å polysilicon floating gate 118 is formed over a silicon dioxide layer which is 100 Å over a first portion 116a of the write transistor channel region 116 and also 100 Å over the read channel region 130. A 3000 Å polysilicon control gate 122 is formed over the floating gate 118 and electrically insulated by a dielectric layer 24 which is comprised of 125 Å oxide and 150 Å silicon nitride and also formed over the second portion 116b of the write channel region, separated from such by a 500 Å silicon dioxide pass oxide region 126.

The operation of the dual transistor embodiment 108 is analogous to the single transistor embodiment described above, except that the write and erase functions are performed using the write transistor and the read functions are performed using the read transistor. Here, the read speed can be independently increased by optimizing the transistor in the read path.

As with the single transistor cell, the dual transistor cell can be one such cell in a larger array of cell and may utilize shared source/drain lines. The operation of this device is analogous to the single transistor array shown in FIG. 2 except that each cell has two bit lines.

Figure 7A:
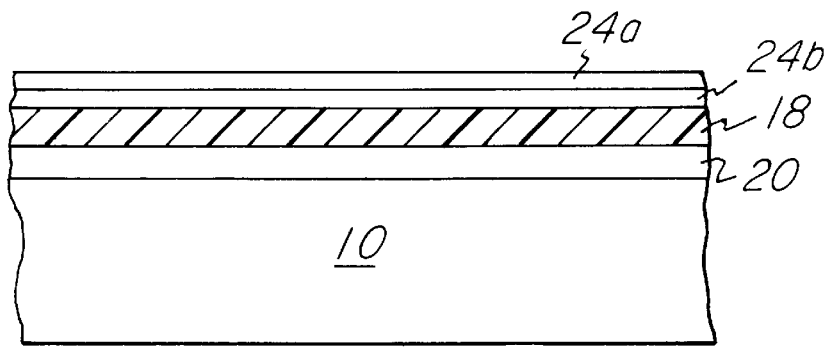
FIG. 7a–7e are cross sectional views of embodiment of FIG. 1 illustrating various steps in the multilayer photolithographic process of the invention.

A process for fabricating the single transistor embodiment of the present invention is illustrated in FIGS. 7a–7e. Referring to FIG. 7a, insulating layer 20 is formed on the surface of substrate 10. One method of forming an insulation layer, for example, is to thermally grow an oxide. The surface of substrate 10 may be doped to a given doping concentration prior to forming the insulation layer 20. Next, conductive layer 18 is formed over insulating layer 20. Conductive layer 18 will become the floating gate. For example, forming conductive layer 18 may comprise depositing and doping, or in situ depositing, polysilicon. Next an insulating layer 24 is formed over conductive layer 18. Layer 24 may comprise multiple layers. As shown in FIG. 7a, for example, layer 24 may comprise an oxide layer 24b formed beneath a nitride layer 24a. The nitride layer 24a is used in this case to control the thickness of layer 24 because later oxidations will be blocked in this region by the nitride.

Figure 7B:
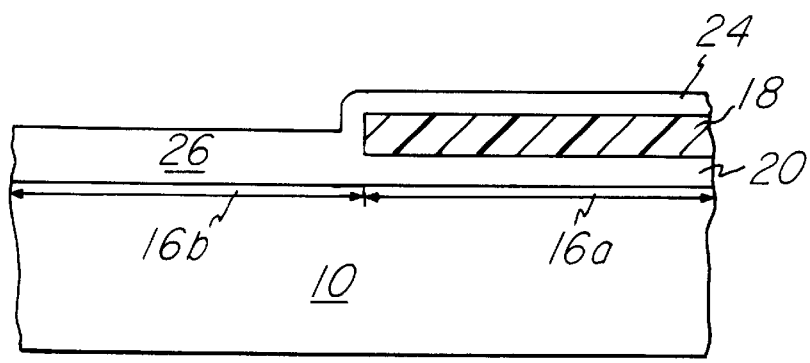
Figure 7C:
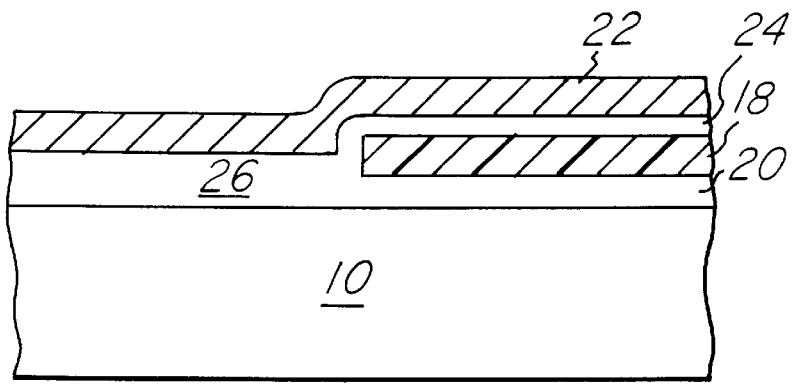

Referring now to FIG. 7b, a portion of the surface is exposed by etching the previously deposited materials 18, 20, and 24. Next another additional insulating layer 26, such as silicon dioxide, is formed over the exposed surface. The layer 26 will serve as the pass gate oxide and as such may be thicker than the layer 20 which will serve as the FAMOS gate oxide. The next process step entails forming a conductive layer 22 for the control gate over insulating layers 24 and 26 as shown in FIG. 7c.

It should be noted that if the doping concentration of the channel region beneath the pass gate oxide is to be different than the doping concentration of the channel region beneath the FAMOS gate oxide, as desired in the preferred embodiment, than an additional doping step is performed before forming layer 26.

Figure 7D:
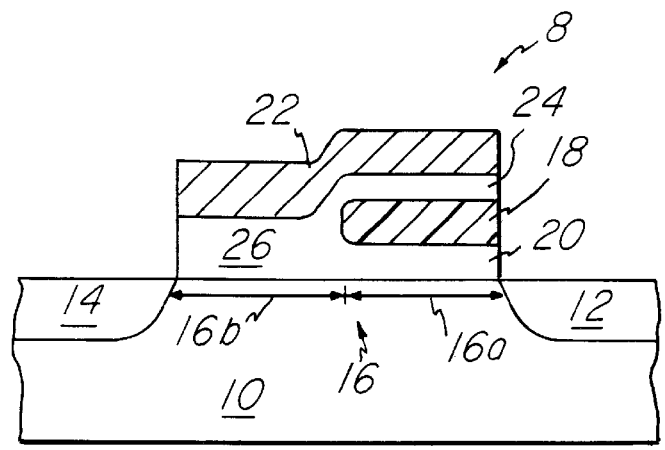

Referring now to FIG. 7d, two portions of the substrate surface are exposed and highly doped regions 12 and 14 are formed to serve as the source and drain.

The techniques which may be used for deposition, doping and etching are well known in the current art and are strictly by design choice.

Figure 7E:
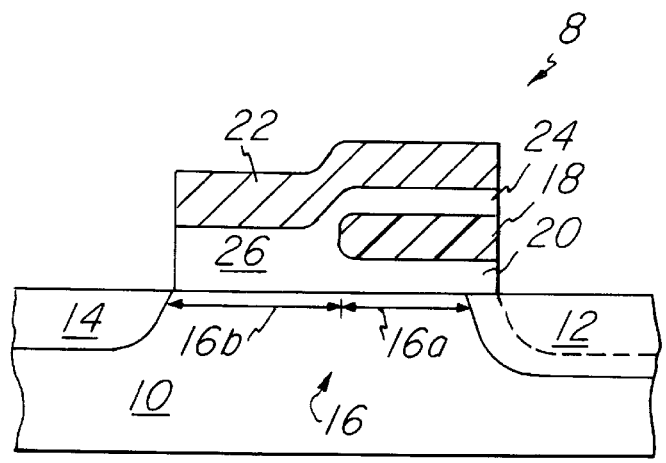

A variation of the preferred embodiment is shown in FIG. 7e. Here a deep graded junction has been formed in the source region 12. One method to form a deep graded junction is to dope the region 12 with both arsenic and phosphorus and dope the region 14 with arsenic only followed by a high temperature bake. The phosphorus will diffuse into the substrate and beneath the floating gate to a greater extent than the arsenic, thereby creating the desired junction.

Figure 8:
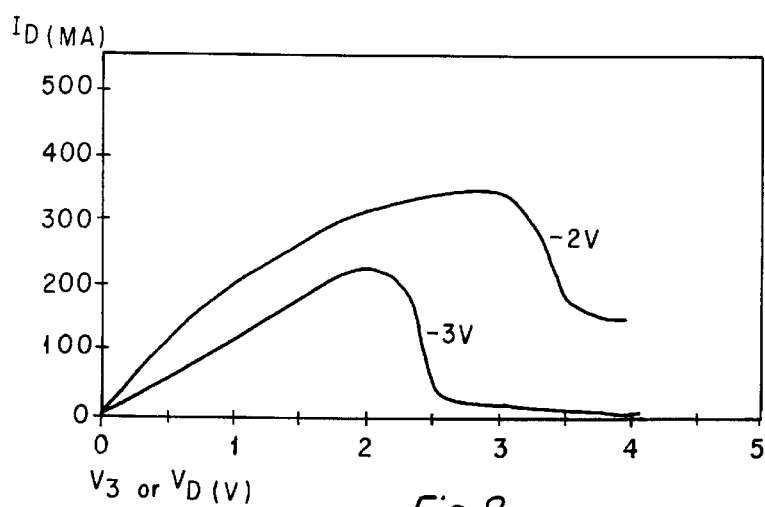
FIG. 8 is a plot of experimental data of drain current as a function of drain voltage for structure built with the single transistor embodiment.

Experimental results of structure built as described above is shown in FIG. 8. FIG. 8 shows the Current-Voltage (IV) curve during programming of the optimized merged gate transistor shown in FIG. 1. The voltages applied during programming were $V_1$(gate)=12 volts, $V_2$(source)=0 volts, $V_4$(substrate)=−2 and −3 volts (as shown by the two curves), while the drain voltage $V_3$ was ramped from 0 to 5 volts. The IV curves for both the −2 V backbias and the −3 volt backbias cases rise with the drain voltage until hot electron injection into the floating gate begins to occur. At this point, a sudden drop in the current is seen as the floating gate charges up and shields the channel region from the control gate voltage. As can be seen in FIG. 8, both backbias curves exhibit programming well below the 5 volt drain voltage limit that is required for a single external power supply part. It should also be noted that the substrate current is on the order of one microamp and therefore can easily be supplied by a charge pump.

It should be noted that the present invention is not only applicable to EPROMs and EPLDs like those described, but also to other kinds of floating gate memories.

A few preferred embodiments have been described in detail hereinabove. It is to be understood that the scope of the invention also comprehends embodiments different from those described, yet within the scope of the claims.

What is claimed is:

1. A non-volatile memory cell structure, comprising:

a semiconductor substrate comprising first and second highly doped regions separated by a first channel region;

a third highly doped region separated from said first region by a second channel region and separated from said second highly doped region by an insulating region;

a conductive floating gate formed over said second channel region and a first portion of the first channel region adjacent to the first doped region, wherein the floating gate is separated from the first portion of the first channel region and the second channel region by a first insulation layer;

a conductive control gate formed substantially over but electrically insulated from the floating gate and formed over a second portion of the first channel region which is not beneath the floating gate, wherein the control gate is separated from the second portion of the channel region by a second insulation layer;

such that said memory cell may be programmed with as little as a 5 volt or less applied to one of said first and second highly doped regions.

2. The structure of claim 1 wherein the thickness of said first insulation layer is less than the thickness of said second insulation layer.

3. The structure of claim 1 wherein the doping concentration in said first portion of said channel region is lighter than the doping concentration in said second portion of said channel region.

* * * * *